United States Patent [19]

Rogovein et al.

[11] Patent Number: 5,537,927
[45] Date of Patent: Jul. 23, 1996

[54] APPARATUS AND METHOD FOR PRECISELY DRILLING ALIGNMENT PIN REGISTER HOLES IN PRE-MARKED FLEXIBLE PRINTING PLATES

[75] Inventors: Michael E. Rogovein, Overland Park, Kans.; Philip A. Tyrrell, Kansas City, Mo.; Richard Kranz, Leawood, Kans.

[73] Assignee: Tension Envelope Corporation, Kansas City, Mo.

[21] Appl. No.: 296,748

[22] Filed: Aug. 26, 1994

[51] Int. Cl.[6] ...................................................... B41F 1/34
[52] U.S. Cl. ...................... 101/485; 101/481; 101/415.1; 33/614; 408/91; 408/103; 408/234; 269/91; 269/307
[58] Field of Search .................................. 101/485, 486, 101/481, 415.1, 382.1, 383, 401.1; 33/614, 617, 618; 408/91, 103, 234; 269/91, 127, 307

[56] References Cited

U.S. PATENT DOCUMENTS

| | | |
|---|---|---|
| 2,760,273 | 8/1956 | Bregman . |
| 3,368,439 | 2/1968 | Bungay, Jr. . |
| 3,406,629 | 10/1968 | Hoexter ................................ 101/415.1 |
| 3,492,900 | 2/1970 | Hill et al. . |
| 3,520,253 | 7/1970 | Head, Jr. . |
| 3,909,329 | 9/1975 | Smolen . |
| 4,467,722 | 8/1984 | Klingelhoefer et al. . |
| 4,582,768 | 4/1986 | Takeuchi et al. . |
| 4,604,811 | 8/1986 | Roosen . |
| 4,727,806 | 8/1988 | Green, Sr. . |
| 5,052,120 | 10/1991 | Lubberts . |
| 5,075,980 | 12/1991 | Kerman . |
| 5,117,751 | 6/1992 | Thompson ............................. 101/485 |
| 5,327,194 | 7/1994 | Doi ........................................ 101/481 |
| 5,345,868 | 9/1994 | Baker .................................... 101/481 |

OTHER PUBLICATIONS

Mosstype, product information literature re "TRANS-MOUNT" CARRIER SYSTEM Dec. 3, 1993.

*Primary Examiner*—Eugene H. Eickholt
*Attorney, Agent, or Firm*—Litman, McMahon and Brown

[57] ABSTRACT

An apparatus and method for aligning flexible printing plates and for accurately drilling pin register holes therein includes a three-way adjustable table top assembly which can be selectively adjusted in X and Y directions and rotated about an axis. A pneumatic clamp is positioned on the table top assembly for clamping a pre-marked flexible printing plate to be drilled in place thereon. A movable stereomicroscope viewer is slidable above the table top assembly to view the flexible plate for position adjustment via the adjustable table top assembly. A drill assembly is also positionable over each location at which a pin register hole is to be drilled. The drill assembly includes a movable hollow core drill bit surrounding a stationary rod. Once the flexible plate is aligned via the viewer, the drill assembly is sequentially positioned above the flexible plate at each point to be drilled with a pin register hole and operated to drill each hole therein.

34 Claims, 5 Drawing Sheets

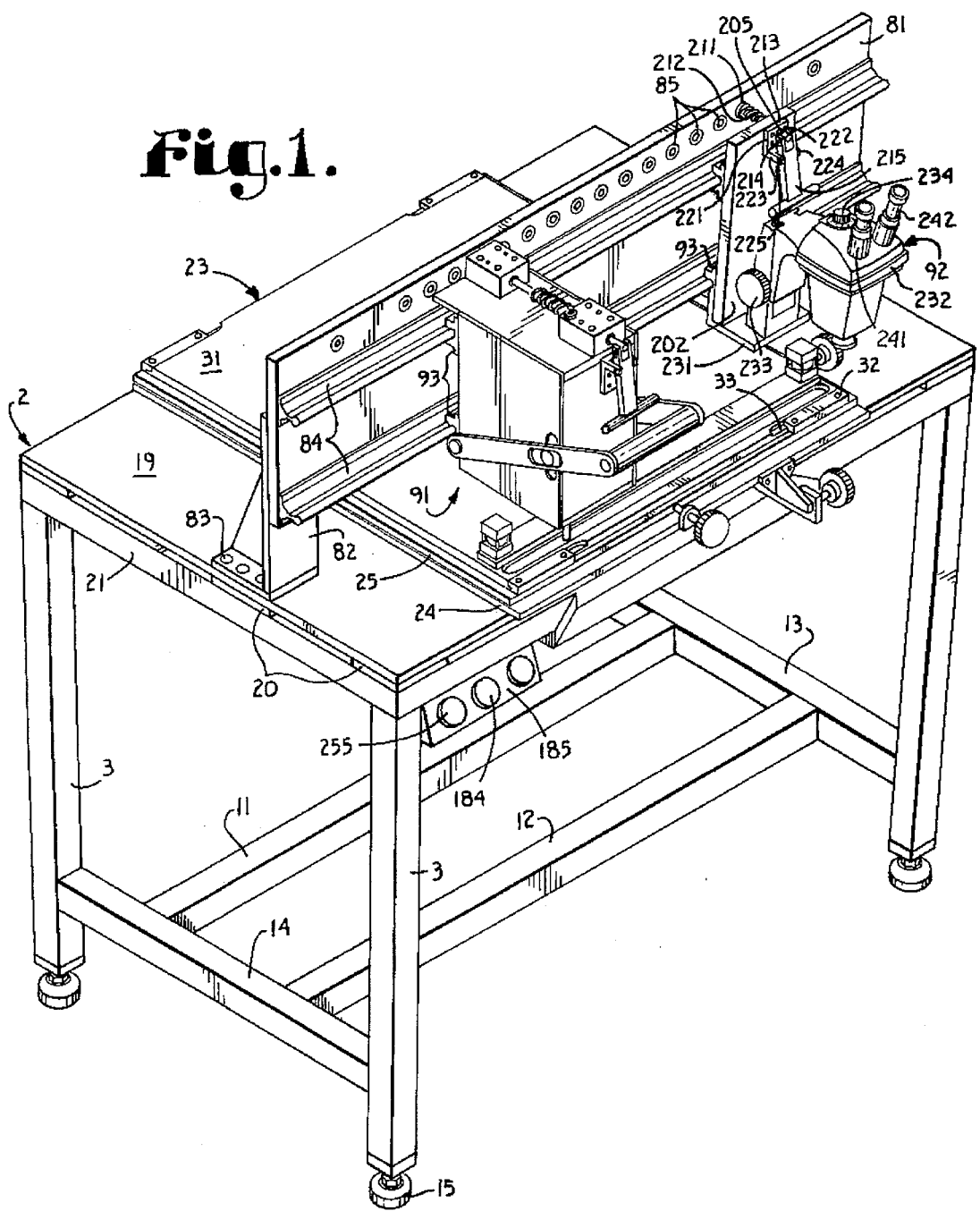

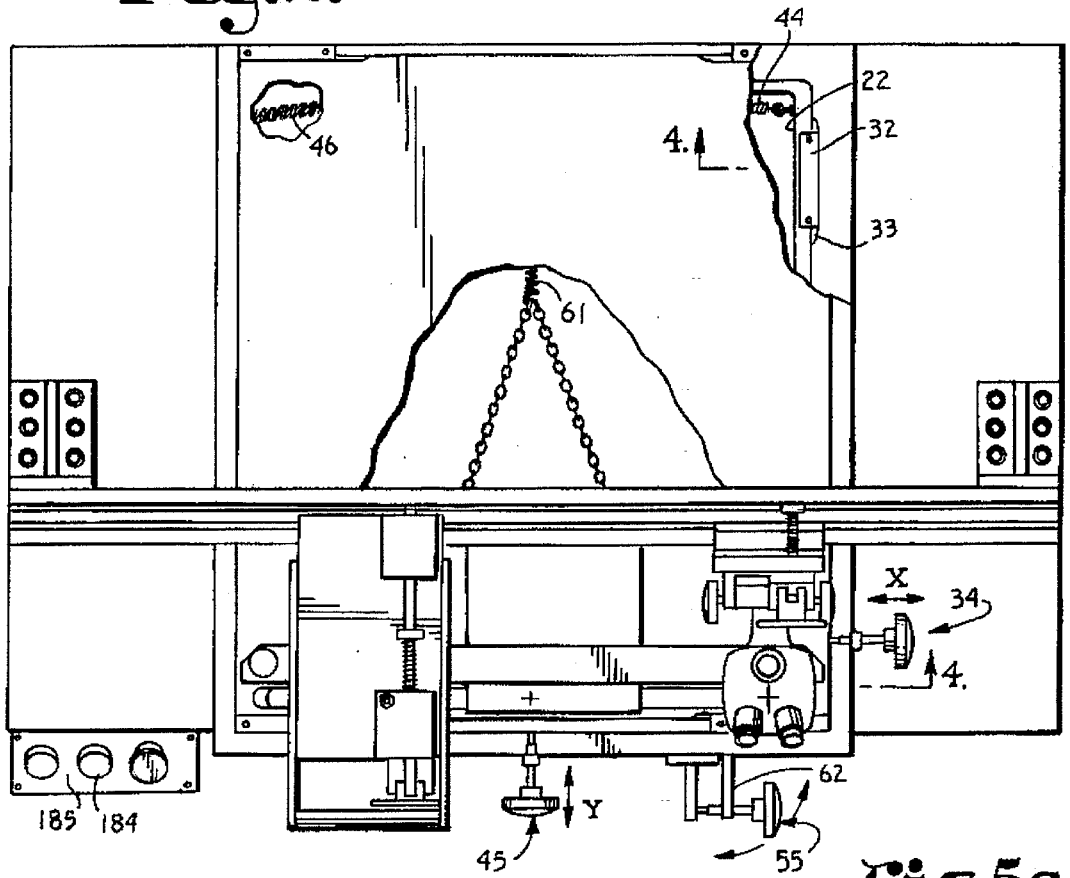
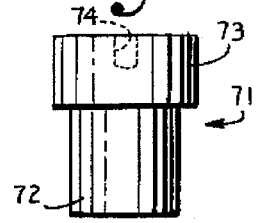
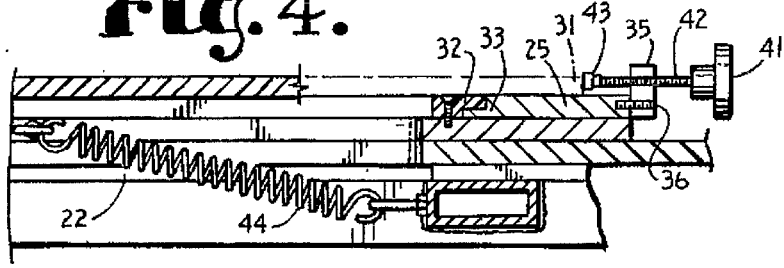
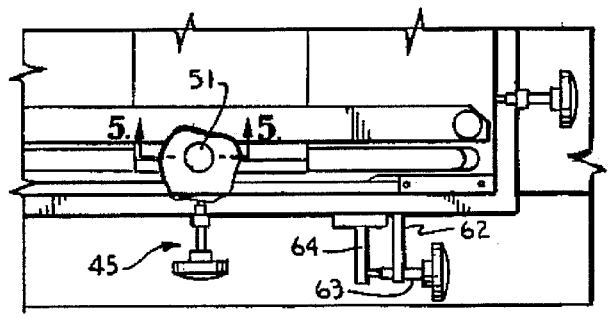
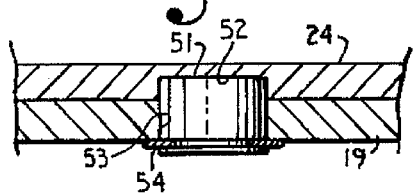

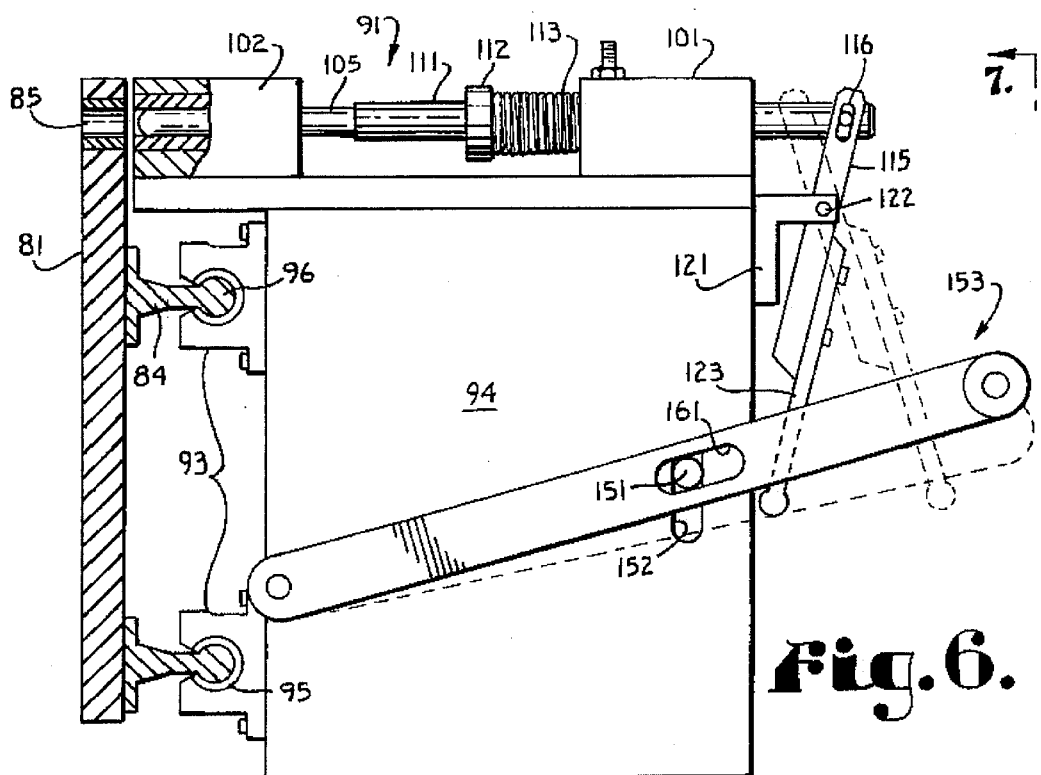
Fig.6.
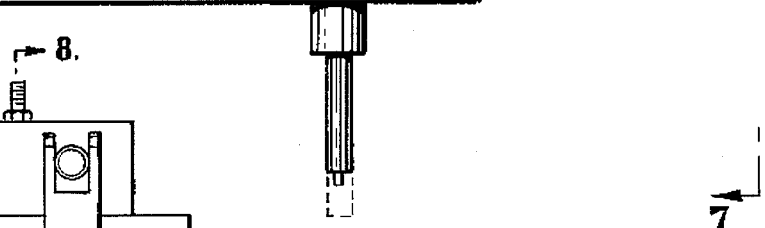
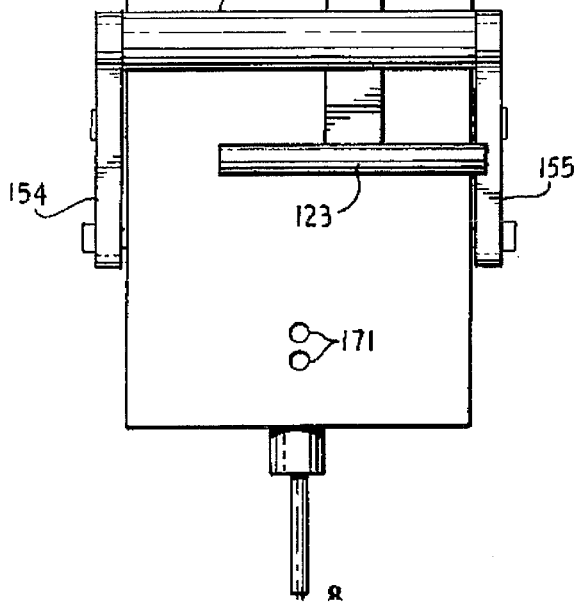
Fig.7.
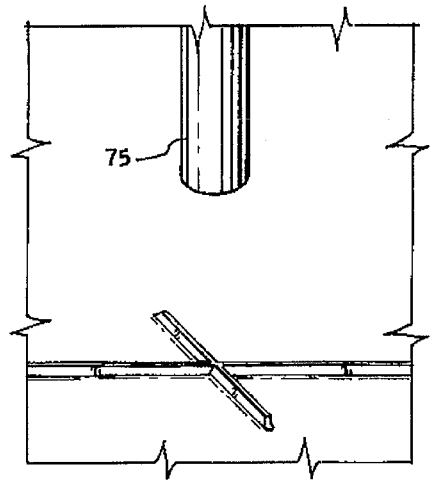
Fig.9.

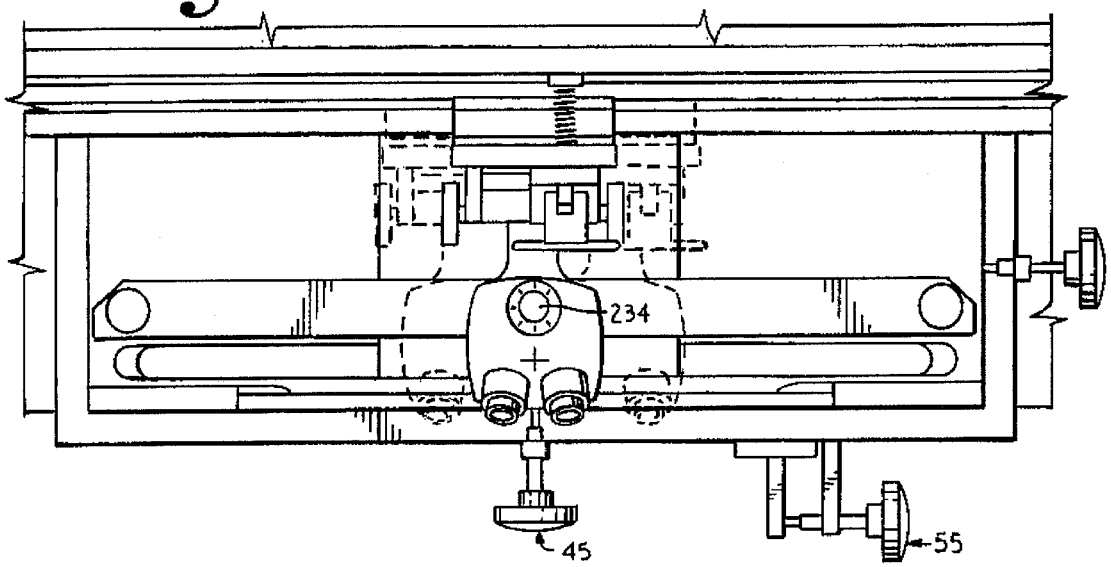
Fig.12.
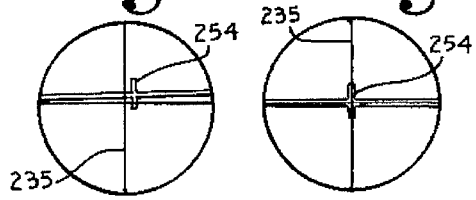 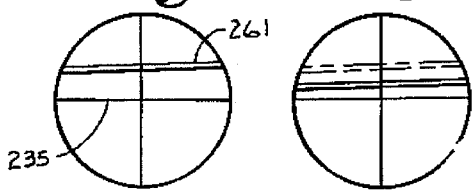
Fig.13a. Fig.13b. Fig.13c. Fig.13d.
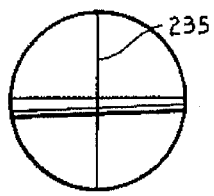 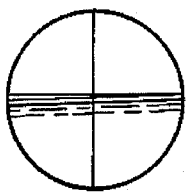 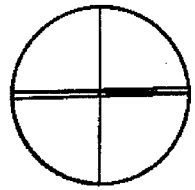 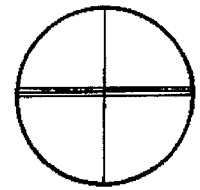
Fig.13e. Fig.13f. Fig.13g. Fig.13h.
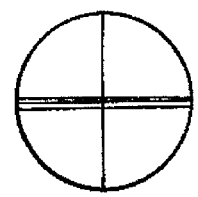 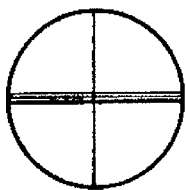 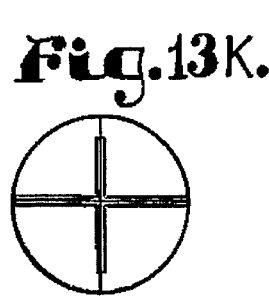
Fig.13i. Fig.13j. Fig.13K.

APPARATUS AND METHOD FOR PRECISELY DRILLING ALIGNMENT PIN REGISTER HOLES IN PRE-MARKED FLEXIBLE PRINTING PLATES

BACKGROUND OF THE INVENTION

1. Field of the Invention

The present invention relates to an apparatus and method for aligning flexible printing plates and for accurately drilling pin register holes therein. More particularly, the invention relates to such an apparatus and method including a three-way adjustable table top assembly for mounting the plate, a stereomicroscope viewer for aligning the plate on the table by sighting pin register hole markings and a drill for drilling the pin register holes once the plate is properly positioned.

2. Description of the Related Art

In flexographic printing presses, flexible printing plates with a raised pattern including a design and/or printed message thereon are adhered to a press plate cylinder, which is positioned adjacent to a backup impression cylinder. Printing ink is applied to the raised design on the plate cylinder and paper to be printed is then pulled between the impression cylinder and the plate cylinder, resulting in an inked imprint of the raised design on the paper.

In order for the press to apply the inked design correctly to the paper, the flexible plate must be precisely aligned on the plate cylinder. This is typically done via pin register holes punched in the flexible plates which are fitted over register pins on a press plate cylinder. In U.S. application for patent Ser. No. 08/266,128 entitled SYSTEM AND APPARATUS FOR PROVIDING PIN REGISTER HOLE MARKINGS ON FLEXIBLE PRINTING PLATES AND APPARATUS AND METHOD FOR ALIGNING PLATES ON A FLEXOGRAPHIC PRINTING PRESS PLATE CYLINDER, filed Jun. 27, 1994, (which application is incorporated herein by reference) a method of placing pin register hole markings on flexible printing plates is described. Briefly, in this method, the pin register hole markings are placed on original artwork used to create an image on the plate and the markings are carried through each step of the plate forming process until they are formed as a part of the raised image on each finished plate. The markings can take the form of an elongate line with a centrally located alignment cross-hair.

Once the finished plates are formed with the pin register hole markings imprinted thereon, pin register holes must be accurately punched or drilled in the plate material at the marking locations in order for the plates to be aligned on printing presses. In order to accomplish this, an apparatus and method was needed which was capable of steadily holding the finished plates for drilling. The apparatus needed to have an adjustable surface upon which the plates could be clamped and an optical alignment system was required to accurately adjust the surface. Finally, a drill or punch was required which could quickly and accurately create the requisite pin register holes on the clamped plate without distorting the plate material and without clogging the drill or punch.

SUMMARY OF THE INVENTION

The present invention is directed to an apparatus and method for aligning flexible printing plates and for accurately drilling pin register holes therein. The apparatus includes a table with a three-way adjustable table top assembly. The table top assembly can be selectively adjusted in X and Y directions and also can be rotated about a center of rotation which is positioned directly under a center marking on a plate to be drilled. Adjustment knobs are provided for adjusting the table top assembly in the three directions. A pneumatic clamp is positioned on the table top assembly for clamping a flexible plate to be drilled in place thereon. The clamp has an elongate opening therethrough which allows access to a pin register portion of the clamped flexible plate. A movable stereomicroscope viewer is slidable along a mounting plate which is oriented vertically and which is spaced above the table top assembly. The viewer is equipped with a cross-hair which is positionable over the pin register hole markings. A plurality of positioning bores are provided in the vertical mounting plate, with the bores spaced at intervals at which pin register holes are to be drilled in the plates. A spring-loaded latch pin attached to the stereomicroscope viewer can be selectively engaged in any of the positioning bores to place the viewer cross-hairs directly over a pin register hole location. A drill assembly is also slidably attached to the vertical plate and is similarly equipped with a spring loaded latch pin such that the drill is positionable over each location at which a pin register hole is to be drilled.

An operator, in order to precisely drill pin register holes in a flexible printing plate, first positions the printing plate beneath the pneumatic clamp and visually aligns a pin register hole marking line along the center of the elongate opening in the clamp. A switch is then tripped which causes the clamp to tightly clamp the flexible plate onto the table top assembly. Next the stereomicroscope viewer is positioned with a viewing reticle precisely over the center of rotation of the table top assembly in position to view a center crosshair on the flexible plate. The viewer is then locked in place via the spring loaded pin. The three adjustment knobs are then turned such that the central crosshair on the plate is aligned with a crosshair reticle in the viewer. Next the viewer is released and pulled along the mounting plate toward one end of the flexible plate where it is again locked in place. The pin register line is viewed through the viewer and the table is adjusted to accommodate one-half of the difference between the viewer reticle and the pin register line. Next the viewer is released and pulled toward the opposite end of the flexible plate and locked in place and the table top assembly is again adjusted to take up one-half of the positioning error. This process is repeated until any remaining positioning error is imperceptible, the viewer is then positioned at the center of rotation, a final alignment adjustment is done and the viewer is then pulled completely out of the way. Next, a switch is thrown which starts a drill motor in the drill assembly. The drill assembly is pulled along the support plate and latched in place at each pin register hole location in sequence. When the drill assembly is latched in place above a pin register hole location, a drill control handle is pulled down by the operator. This lowers a spinning drill bit set into contact with the flexible plate. The drill bit set includes a cylindrical bit with a hollow interior, which, as it is spinning, precisely drills a hole in the plate, which is formed of a mylar backed polymer material. A stationary rod is positioned within the cylindrical drill bit such that, as the bit is lowered, it extends past the rod. After the hole is drilled, the operator raises the drill control handle, which raises the drill bit. The drilled out core of the resulting pin register hole is carried upward in the hollow drill bit interior. When the drill bit encounters the stationary rod, the rod pushes out the hole core, which drops onto the table.

This prevents the drill bit from being clogged. The drill assembly is repositioned at each hole location until all needed pin register holes are drilled. The pneumatic clamp is then released, the precisely drilled flexible plate is removed and the process repeated.

OBJECTS AND ADVANTAGES OF THE INVENTION

The principal objects of the present invention include: to provide an improved apparatus and method for precisely drilling alignment pin register holes in pre-marked flexible printing plates; to provide such an apparatus with a table equipped with a three-way adjustable table top assembly; to provide such an apparatus in which a pneumatic clamp is attached to the table top assembly to selectively clamp a flexible plate thereon; to provide such an apparatus in which a vertically oriented mounting plate is positioned above the table top assembly and is equipped with a pair of tracks for slidably mounting a stereomicroscope viewer and a drill assembly; to provide such an apparatus in which the mounting plate is equipped with a plurality of alignment bores and both the viewer and the drill assembly are equipped with a spring loaded latching pin such that the viewer or the drill assembly can be selectively latched in position above any one of a plurality of pin register hole locations; to provide such an apparatus in which the drill assembly is equipped with a movable hollow core drill bit within which is positioned a stationary rod such that, as the drill bit is lowered, it extends out past the rod, and, as the bit is raised, it is pulled upward past the end of the rod, which causes any plate hole core to be pushed out of the drill bit interior; to provide such a method in which an operator first visually positions a pre-marked flexible plate on the table top assembly and clamps it in position; to provide such a method in which the stereomicroscope viewer and the three-way adjustable table top assembly are then used to precisely align the plate for drilling; to provide such a method in which the drill assembly is then used to drill pin register holes at predetermined distances along the precisely aligned plate; and to provide such an apparatus and method which are particularly well adapted for their intended purposes.

Other objects and advantages of this invention will become apparent from the following description taken in conjunction with the accompanying drawings wherein are set forth, by way of illustration and example, certain embodiments of this invention.

The drawings constitute a part of this specification and include exemplary embodiments of the present invention and illustrate various objects and features thereof.

BRIEF DESCRIPTION OF THE DRAWINGS

FIG. 1 is a perspective view of a flexible plate pin register hole drilling apparatus according to the present invention.

FIG. 2 is an enlarged, top plan view of the drilling apparatus of FIG. 1, with portions of a table top assembly broken away to illustrate the interior construction thereof and with directional arrows indicating the control directions of the three adjustment knobs.

FIG. 3 is an enlarged, fragmentary top plan view of the drilling apparatus, with portions broken away to illustrate a rotational axis and support for the adjustable table top assembly.

FIG. 4 is an enlarged, fragmentary, cross-sectional view of a portion of the table and the table top assembly, taken along line 4—4 of FIG. 2, and illustrating a biasing spring and a plate to plate attachment bracket.

FIG. 5 is an enlarged, fragmentary, cross-sectional view of a portion of the table top assembly, taken along line 5—5 of FIG. 3, and illustrating the connection of a machined rotational axis member in the adjustable table top assembly and a fixed table surface.

FIG. 5a is a side view of a drill alignment tool.

FIG. 6 is an enlarged, side elevational view of the drill assembly of the inventive drilling apparatus, with a control handle and a drill bit shown in solid lines in a raised position and in phantom lines in an engaged, lowered position and with a latch mechanism shown in solid lines in a released position and in phantom lines in a latched position.

FIG. 7 is a front elevational view of the drilling assembly of FIG. 6.

FIG. 9 is a greatly enlarged, fragmentary view of a drill bit approaching a flexible plate which is pre-marked with pin register hole markings.

FIG. 12 is a fragmentary, top plan view of the drilling apparatus, with the stereomicroscope viewer shown positioned over the table rotation center in solid lines and in left and right positions in phantom lines.

FIGS. 13a–13k are a series of representative magnified images which an operator would see while adjusting the position of a flexible plate for drilling in performing a method according to the present invention.

DETAILED DESCRIPTION OF THE INVENTION

Figure 8:
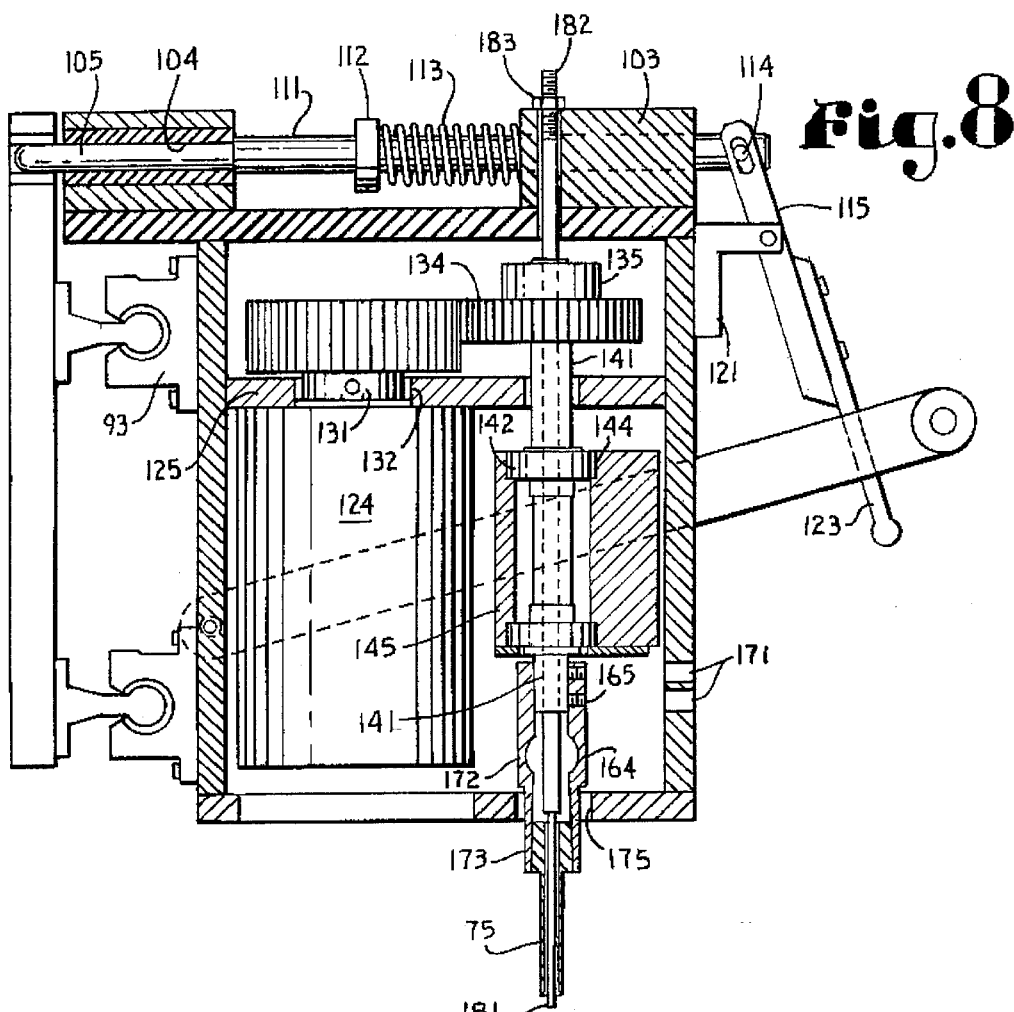
FIG. 8 is a cross-sectional view of the drilling apparatus, taken along line 8—8 of FIG. 7, and illustrating a handle lever arm in phantom lines.

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

I. Flexible Printing Plate Pin Register Hole Drilling Apparatus

Referring to FIG. 1, a flexible plate pin register hole precision drilling apparatus is generally indicated as 1. The apparatus 1 includes a table 2, supported by fixed table legs 3 and cross supports 11–14. Threaded adjustable feet 15 are provided on the base of legs 3 to allow the table 2 to be leveled. The table 1 includes a stationary table surface 19, which is supported by a plurality of plates 20 attached to a rectangular frame 21. The table surface 19 is also rectangular with a generally rectangular center aperture 22 cut therein (FIGS. 2 and 4).

A three-way adjustable table top assembly 23 is positioned atop the table surface 19. The assembly 23 includes a bottom, rotational plate 24, an intermediate, Y plane adjustable plate 25 and a top, X plane adjustable plate 31. The intermediate plate 25 is slidably attached to the bottom plate 24 via four plastic L-shaped brackets 32 (only one of which is shown in FIG. 2) mounted on the bottom plate 24 and four matching L shaped edges 33, which are sized and positioned to allow the intermediate plate 25 to slide back and forth in the Y direction relative to the brackets 32 and thus the bottom plate 24. The top plate 31 is similarly attached to the intermediate plate 25 via four of the plastic brackets 32 interacting with four matching edges 33 in the top plate 31. Thus, the top plate 31 is movable back and forth in the X direction relative to the intermediate plate 25.

An X direction adjustment knob 34 is attached to the intermediate plate 25 via a bracket 35 and screw 36 threaded into a bore in the plate 25. The knob 34 includes a circular handle 41 attached to a threaded rod 42 which terminates in a plastic bushing 43 which contacts the top plate 31. As the knob handle 41 is turned clockwise, the bushing 43 pushes against the top plate 31, urging it to the left in FIGS. 2 and 4. A pair of springs 44 connected between the intermediate plate 25 and the top plate 31 simultaneously urge the top plate 31 to the right. Thus, as the knob handle 41 is turned counter-clockwise, the springs 44 pull the top plate 31 back to the right.

A Y direction adjustment knob 45 is identical in construction to the knob 34, but is attached between the intermediate plate 25 and the bottom plate 24. The knob 45 serves to adjust the intermediate plate 25 in the Y direction, as indicated by the arrows in FIG. 2, with the aid of a pair of springs 46 which are attached between the intermediate plate 25 and the bottom plate 24.

The third adjustment for the table top assembly 23 is a rotary adjustment about a pivot pin 51. Referring to FIG. 5, the pivot pin 51 is machined into a recess 52 in the bottom of the bottom plate 24. During assembly of the drilling apparatus 1, the pivot pin 51 is inserted through a bore 53 in the stationary table surface 19, and is secured therein via a spring loaded ring 54 which is inserted into a slot in the pin 51. Thus, the entire table top assembly 23 is angularly adjustable about the axis defined by the pivot pin 51. In order to adjust the table top assembly 23 about the pivot pin 51, a third adjustment knob 55 and a plurality of springs 61 are used. The knob 55 is attached to the stationary table surface 19 via a bracket 62 through which a threaded shaft 63 of the knob 55 extends. The end of the shaft 63 bears against a T shaped arm 64 which is rigidly attached to the bottom plate 24. As the knob 55 is turned clockwise, the arm 64 is urged to the left, thus causing the bottom plate 24 (along with the attached intermediate and top plates 25 and 31, respectively) to pivot clockwise about the pivot pin 51. Alternatively, when the knob 55 is turned counterclockwise, the springs 61 urge the bottom plate 24 in the opposite direction such that the bottom plate 24 rotates counterclockwise about the pin 51.

Referring to FIG. 5a, a drill alignment tool 71 is illustrated. The alignment tool 71 is used when the drilling apparatus 1 is being assembled. The tool 71 includes a relatively small diameter cylindrical bottom portion 72 which is the same diameter as the pivot pin 51. The bottom cylinder 72 is attached to a larger diameter cylindrical top portion 73. A bore 74 is precisely machined to extend partially through the radial center of the top cylinder 73, and the bore 74 is sized to accommodate a drill bit 75 from a drill assembly 91. As the apparatus 1 is being assembled, the tool 71 is inserted, small end down, into the bore 53 in the stationary table surface 19. The drill assembly and support structure is then positioned such that the end of the drill bit 75 precisely fits the bore 74. The tool 71 is then removed from the table surface 19 and the table top assembly 23 is attached to the surface 19 via the pivot pin 51.

A vertically oriented support plate 81 is attached at either end to a pair of brackets 82. Each bracket 82 is attached to the stationary surface 19 via a plurality of bolts 83. The support plate 81 includes a pair of elongate tracks 84 attached to a front surface thereof and extending lengthwise along the plate 81. Just above the top track 84 are a plurality of pin register hole positioning bores 85 which are centered between a pair of home positioning bores 86 and 87. A drill assembly 91 and a stereomicroscope viewer assembly 92 are each slidably attached to the support plate 81 via a pair of bifurcated track engaging brackets 93. A central one of the positioning bores 85a is positioned such that either the drill assembly 91 or the viewer assembly 92 is precisely aligned with the center of the pivot pin 51 when they are latched in position therein. This precise alignment is accomplished during assembly by use of the alignment tool 71, as described above.

Referring to FIGS. 6–12, the drill assembly 91 is shown in detail. Referring to FIG. 6, the drill assembly 91 includes a generally rectangular housing 94 to the rear of which are attached the pair of track engaging brackets 93. Each bracket 93 has a bearing 95 partially surrounding a generally circular protuberance 96 on the connected track 84 to facilitate the sliding of the drill assembly 91 along the tracks 84.

Attached to the top of the housing 94 is a plate 97 which is cantilevered over the rear end of the housing 94. A pair of rectangular supports 101 and 102 are attached atop the plate 96. The front support 101 has a bore 103 extending from front to back therethrough and the rear support 102 also has a bore 104 extending from front to back therethrough. A cylindrical latch pin 105 extends through the bores 103 and 104 and a sleeve 111 surrounds and is rigidly attached to the pin 105 between the supports 101 and 102. The sleeve 111 abuts a spacer 112, which also surrounds the pin 105. A coil spring 113 surrounds the pin 105 and is positioned between the spacer 112 and the back side of the support 101. The pin 105 has a small pivot pin 114 extending crosswise therethrough and a latching lever 115 is attached to either side of the pivot pin 114 via a pair of elongate slots 116. An L shaped bracket 121 is attached to the front of the housing 94 and the plate 96 and the latching lever 115 is pivotally attached to the L bracket 121 via a pivot pin 122. A T handle 123 is attached to the lever 115.

The latching pin 105 is sized to fit within any one of the positioning bores 85 in the support plate 81. In order to move the drill assembly 91 along the support plate 81, the T handle 123 is pushed inward to the position shown in solid lines in FIG. 6. In this position, the pin 105 is pulled against the action of the spring 113 and is retracted from the bores 85 in the support plate 81. The drill assembly 91 is then slid along the tracks 84 to a desired drilling position. It should be noted that the positioning bores 85 are spaced at even intervals along the support plate 81 which intervals coincide with the spacing of pin register holes in a flexible printing plate. At this point, the T handle 123 is released, thus moving from the dotted line position in FIG. 6 to the solid line position by action of the spring 113. This causes the pin 105 to be inserted into the positioning bore 85 to thereby latch the drilling assembly 91 in a selected position.

Referring again to FIGS. 6–12, the drill assembly 91 includes a drill motor 124 attached to a horizontal support 125 in the housing 94. The motor 124 has attached thereto a drive shaft 131 which extends upward through a bore 132 in the support 125. A drive gear 133 is attached to the drive shaft 131. The gear 133 is intermeshed with a drill bit gear 134, which is rigidly attached on one side to a bearing 135 and on the other side to a hollow cylindrical shaft 141. The shaft 141 is supported by bearings 142 which are press fit into bore 144 in a block 145. The block 145 includes a pair of support pins 151 which extend out from the block 145 on either side and through a corresponding pair of elongate slots 152 in the sides of the housing 94. A drill operating handle 153 includes a pair of arms 154 and 155, each with an elongate slot 161 therein for accommodating a respective one of said pins 151. A handle grip 162 is pivotably attached at either end to one of the arms 154 and 155 and the opposite end of each arm 154 and 155 is pivotably attached to the housing 94 at pivot points 163.

The shaft 141 extends out the bottom of the block 145 and a drill bit set 164 is attached thereto via a pair of set screws 165. The set screws 165 are accessible via a pair of bores 171 in the housing 94. The drill bit set 164 includes a relatively large diameter upper support section 172 which progressively tapers inward at intermediate support section 173 and finally in the hollow cylindrical bit 75, which is sized to drill pin register holes. The bit 75 extends out through a bore 175 in the bottom of the housing 94.

Referring to FIG. 8, a stationary rod 181 extends from the top of the housing 94, through the centers of the bearing 135, the drill gear 134, the shaft 141, the drill bit set 164 and the drill bit 75. The rod 181 has a threaded portion 182 at the top thereof with a nut 183 threaded thereon. The nut 183 serves as an adjustment tool for varying the length of the rod 181 to accommodate for wear of the drill bit 75.

Figure 10:
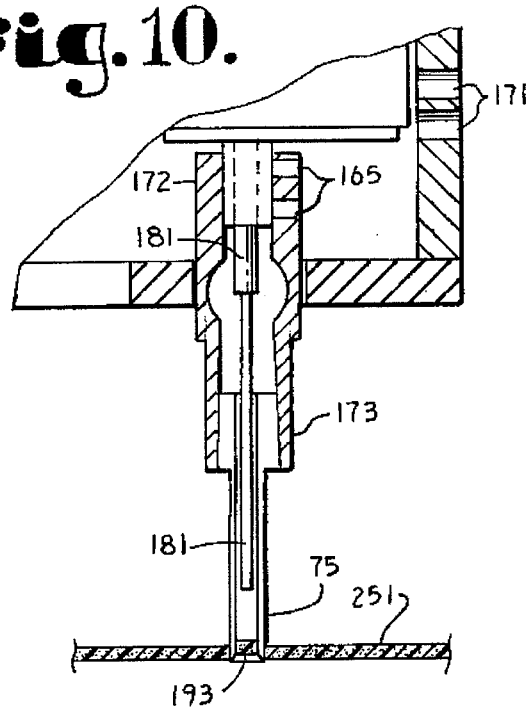
FIG. 10 is a greatly enlarged, fragmentary cross-sectional view of a portion of FIG. 8, illustrating the drill bit engaged and drilling through a flexible plate.
Figure 11:
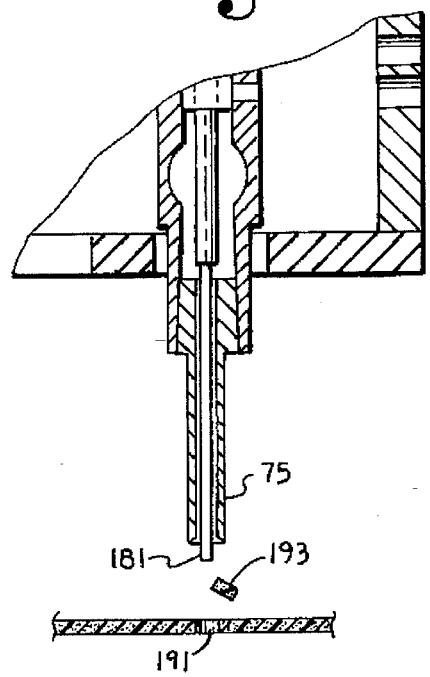
FIG. 11 is a greatly enlarged, fragmentary cross-sectional view of a portion of FIG. 8, illustrating the drill bit being raised and with a hole core being ejected from the drill bit hollow center by a stationary rod.

An electrical switch 184 on a control panel 185 serves to control the drill motor 124. As the switch 184 is turned on, the motor 124 starts spinning the motor gear 133, the drill gear 134, the shaft 141, and the drill bit 75. In order to drill a pin register hole, such as the hole 191 in FIGS. 10 and 11, the handle grip 162 is pulled downward by an operator until the spinning bit 75 encounters a flexible plate 192. As the spinning bit 75 drills the hole 191, a core of plate material 193 from the hole 191 is pushed upward into the interior of the hollow bit 75. Once the hole 191 is drilled, which takes less than one second, the operator raises the handle 153, which raises the block 145 and the connected bit 75. Referring to FIG. 11, as the end of the bit 75 is raised past the end of the fixed rod 181, the rod 181 kicks the hole core 193 out of the interior of the bit 75. The drill assembly is then ready to be moved to the next pin register hole location so that the process can be repeated.

Referring to FIGS. 6 and 7, the latching T handle 123 serves as a safety stop for the drill assembly 91. When the T handle 123 is in the unlatched position, as shown in solid lines in FIG. 6, the right side of the T handle 123 serves to block the right arm 155 of the drill handle 153, and prevents the drill handle 153 from being pulled downward to engage the drill bit 75. Thus, when the drill assembly 91 is in an unlatched state, as when it is being moved between positioning bores 85 on the support plate 81, the drill cannot be operated. By contrast, when the drill assembly 91 is positioned and latched into a positioning bore 85, the latch T handle 123 is raised to the latch position shown in dotted lines in FIG. 6, and the right side of the T handle 123 is raised sufficiently to allow the drill handle 153 to be pulled downward to its drill engaging position. This safety feature prevents holes from being inadvertently drilled at locations other than the regularly spaced pin register hole locations.

Referring to FIG. 12, a viewer assembly 201 is illustrated. The viewer assembly 201 includes a vertical plate 202 to which are attached the pair of track engaging brackets 93. A latching mechanism includes a latching pin 205, with a washer 211 and a coil spring 212 surrounding the pin 205. The latching pin 205 includes a pivot pin 213 extending cross-wise therethrough, which pivot pin 213 engages slots 214 in a latch T handle 215. A pivot bracket 221 is attached to the vertical plate 202 and has a bore 222 extending therethrough. The latching pin 205 extends through the bore 222. The pivot bracket 221 includes a pair of outwardly extending arms 223 with bores 224 extending cross-wise therethrough. The latch T handle 215 also has a bore (not shown) extending therethrough and a pin 225 extends through the bores 224 in each arm 223 and through the T handle 215. The pin 225 thus serves as a pivot point about which the T handle 215 pivots. As in the T handle 123 associated with the drill assembly 91, when the T handle 215 is pushed inward, the latching pin 205 is pulled out of one of the positioning bores 85 against the action of the spring 212. The viewer assembly 201 can thus be slid along the tracks 84 to a desired viewing position. The T handle 215 is then pulled upward and this action, plus the spring action of the coil spring 212 serve to force the latching pin 205 into a selected one of the positioning bores 85, thus latching the viewer assembly 201 in position.

An L shaped plate 231 is attached to the vertical plate 202 and a stereomicroscope 232 is attached to a horizontal portion of the L plate 231. The stereomicroscope 232 is generally conventional, with a focus adjustment knob 233 for adjusting the focal length of the microscope 232, and a magnification power adjustment knob 234 for adjusting magnification power. Preferably the magnification adjustment knob 234 is fixed to a single power, such as 10X. This is because the apparent position of a cross-hair reticle 235 (FIGS. 14a–14k) viewed through the microscope 232 by an operator varies as the magnification power is adjusted.

The stereomicroscope 232 has a pair of eyepieces 241 and 242. One significant difference between the stereomicroscope 232 and conventional microscopes is that only one of the eyepieces 241 and 242 is adjustable laterally for viewer eye spacing, here indicated as the right eyepiece 242. In conventional microscopes, both eyepieces would be adjustable toward and away from each other. The reason that only one of the eyepieces 241 and 242 is movable is again related to the apparent positioning of the reticle 235 from an operator's perspective. The reticle position can be tied to a single, fixed one of the eyepieces, such as 241, and relative movement of the other eyepiece 242 does not effect apparent reticle position. On the other hand, if both eyepieces 241 and 242 were movable, the apparent reticle position from the operator's perspective would vary with each adjustment. Movement of the eyepiece 242 is accomplished, for example, via an internal rack and pinion gear (not shown).

II. Flexible Printing Plate Pin Register Hole Drilling Method

Referring to FIGS. 12 and 13a–13k, a flexible printing plate, such as the plate 251 illustrated in FIG. 15, is positioned to be drilled with pin register holes by the apparatus 1. In order to precisely position the plate 251, an operator first places the plate 251 on the top plate 31 of the table top assembly 23, beneath a clamp arm 252 of a pneumatically operated clamp 253. The operator then visually aligns the plate 251 by positioning a center cross-hair 254 at the approximate center of rotation of the table top assembly 23, i.e. above the center of the pivot pin 51 (FIG. 3). The viewer assembly 201 is then moved to a position in which it is latched in place via the central positioning bore 85a. In this position, the reticle 235 is centered over the center of the pivot pin 51, a position shown in solid lines in FIG. 13. The table top assembly 23 is then adjusted in X, Y and rotation positions until the reticle 235 and the center cross-hair 254 are aligned as closely as possible. These initial visual and viewer-aided alignment steps are illustrated in FIGS. 13a and 13b, respectively. Once the plate 251 is positioned as shown in FIG. 14b, the operator then activates the clamp 253 by hitting a palm switch 255 on the control panel 185. As an alternative, a foot-operated treadle switch (not shown) can be provided to keep the operator's hands free. The activation of the clamp 253 causes the clamp arm 252 to be pulled downward, thus clamping the plate 251 in position on the top plate 31.

Next the operator moves the viewer assembly 201 to the right side of the plate 251, as shown in phantom lines in FIG. 12. The operator will see a view somewhat like that shown in FIG. 14c, where an elongate pin register position line 261 is positioned askew of the reticle 235. The angular adjustment knob 55 is then adjusted to eliminate approximately one-half of the positioning error between the line 261 and the reticle 235, as shown in FIG. 13d. The viewer assembly 201 is then moved to the left side of the plate 251, again as shown in phantom lines in FIG. 12, where the operator would see a view somewhat like that shown in FIG. 14e. The angular adjustment knob 55 is then turned to eliminate one-half of the position error, as shown in FIG. 13f. This right-left alternating adjustment can be repeated, as shown in FIGS. 13g–13j, until any perceptible positioning error is eliminated. The last adjustment step, indicated at FIG. 13k, is again made with the viewer assembly 201 latched in the center position, and is accomplished by moving the Y adjustment knob 45 until the line 261 and the reticle 235 are precisely positioned.

After a final, left-right check is made with the viewer assembly 201, it is slid to a right "home position" by latching it in the right positioning bore 87, completely out of the way of the plate 251. The drill motor 124 is then started by pushing the button 184 on the panel 185 and the drill assembly 91 is moved and latched to the first positioning bore 85 which will place the drill assembly 91 over the clamped plate 251. The drill handle grip 162 is then grasped and lowered until the spinning drill bit 75 encounters the plate 251 at the correctly positioned pin register line 261, as shown in FIG. 1. A pin register hole 191 is then drilled at this location and the handle grip 162 is raised, as shown in FIGS. 10 and 11. The drill assembly 91 is then unlatched and moved to the next positioning bore 85 and the process is repeated until all pin register holes have been drilled. The drill motor 124 is then shut off, the drill assembly 91 is moved to a far left home position of positioning bore 86, the clamp 253 is released and the drilled plate 251 is removed from the apparatus 1. The plate 251 is thus ready for mounting on a printing plate cylinder, as taught by the aforementioned copending U.S. application for patent Ser. No. 08/266,128 now U.S. Pat. No. 5,511,479 entitled SYSTEM AND APPARATUS FOR PROVIDING PIN REGISTER HOLE MARKINGS ON FLEXIBLE PRINTING PLATES AND APPARATUS AND METHOD FOR ALIGNING PLATES ON A FLEXOGRAPHIC PRINTING PRESS PLATE CYLINDER.

It is to be understood that while certain forms of the present invention have been illustrated and described herein, it is not to be limited to the specific forms or arrangement of parts described and shown.

What is claimed and desired to be secured by Letters Patent is as follows:

1. Apparatus for precisely drilling pin register holes in a pre-marked flexible printing plate, comprising:
   a. an adjustable table top assembly which is selectively angularly adjustable about an axis;
   b. first adjustment means for selectively adjusting said table top assembly about said axis;
   c. clamp means for selectively clamping said printing plate in position on said adjustable surface;
   d. optical means for viewing marks on said flexible plate while said table top assembly is adjusted to align said flexible plate; and
   e. drill means for drilling said pin register holes in said flexible plate.

2. Apparatus as in claim 1, wherein:
   a. said adjustable table top assembly is also selectively adjustable in orthogonal X-Y directions.

3. Apparatus as in claim 2, and further comprising:
   a. second and third adjustment means for selectively adjusting said adjustable table top assembly in said X and Y directions, respectively.

4. Apparatus as in claim 3, said table top assembly comprising:
   a. a bottom plate which is angularly adjustable about a pivot pin attached between it and a stationary support surface;
   b. an intermediate plate which is slidably attached to said bottom plate for motion in one of said X or Y directions; and
   c. a top plate which is slidably attached to said intermediate plate for motion in the other of said X and Y directions.

5. Apparatus as in claim 4, said first adjustment means comprising:
   a. a first bracket attached to said stationary surface, said first bracket including a threaded bore;
   b. a first adjustment knob, said first knob including a threaded shaft extending through said threaded bore in said first bracket; and
   c. a rigid arm attached to said bottom plate and positioned such that said threaded shaft bears against said rigid arm to thereby selectively rotate said bottom plate about said pivot pin as said first knob is turned.

6. Apparatus as in claim 5, said first adjustment means further comprising:
   a. first spring means for biasing said bottom plate against said threaded shaft.

7. Apparatus as in claim 6, said second adjustment means comprising:
   a. a second bracket rigidly attached to said bottom plate, said bracket including a threaded bore;
   b. a second adjustment knob, said second knob including a threaded shaft extending through said threaded bore in said second bracket and contacting one side of said intermediate plate such that said threaded shaft bears against said intermediate plate to thereby slide said intermediate plate relative to said bottom plate in said one of said X and Y directions as said second knob is turned; and
   c. second spring means for biasing said intermediate plate against said threaded shaft.

8. Apparatus as in claim 7, said third adjustment means comprising:

a. a third bracket rigidly attached to said intermediate plate, said third bracket including a threaded bore;

b. a third adjustment knob, said third knob including a threaded shaft extending through said threaded bore in said third bracket and contacting one side of said top plate such that said threaded shaft bears against said top plate to thereby slide said top plate relative to said intermediate plate in said other of said X and Y directions as said third knob is turned; and c. third spring means for biasing said top plate against said threaded shaft.

9. Apparatus as in claim 2, and further comprising:

a. a vertically oriented elongate support plate positioned above and attached to a horizontal stationary support surface, said support plate including a plurality of positioning bores spaced along its length; and b. a track mechanism attached to one side of said support plate.

10. Apparatus as in claim 9, said optical means comprising:

a. a support including slide brackets for attachment to said track mechanism such that said optical means is positioned above said table top assembly and is slidable along the length of said track mechanism; and b. a stereomicroscope attached to said support, said stereomicroscope being directed downward toward said horizontal support surface and said adjustable table top assembly and including a reticle positioned in the field of vision of the stereomicroscope for comparison against said markings on said flexible printing plate.

11. Apparatus as in claim 10, said stereomicroscope further comprising:

a. a fixed eyepiece and a movable eyepiece, said fixed eyepiece controlling the position of said reticle such that a viewer perceived reticle position does not change as said movable eyepiece is adjusted.

12. Apparatus as in claim 10, said optical means further comprising:

a. latch means for selectively latching said stereomicroscope in position along said vertical support, said latch means including a pin selectively insertable in any of said positioning bores in said vertical support plate.

13. Apparatus as in claim 9, said drill means comprising:

a. a housing including slide brackets for attachment to said track mechanism such that said drill means is positioned above said horizontal support surface and said table top assembly and is slidable along said vertical support plate;

b. a rotatable hollow core drill bit;

c. a motor for driving said drill bit;

d. drill control means for selectively, vertically moving said drill bit between an upper, retracted position and a lower, drilling position; and e. a stationary rod positioned within the hollow core of said drill bit such that said drill bit extends past a bottom end of said stationary rod when said drill bit is in said drilling position and such that said stationary rod extends past a bottom end of said drill bit rod when said drill bit is in said retracted position.

14. Apparatus as in claim 13, said drill means further comprising:

a. latch means for selectively latching said drill means in position along said vertical support, said latch means including a latch pin selectively insertable in any of said positioning bores in said vertical support plate.

15. Apparatus as in claim 14, wherein:

a. said latch means includes a latch handle movable between a first position in which said latch pin is inserted in a selected one of said positioning bores and a second position in which said latch pin is retracted from said positioning bores;

b. said drill control means includes a drill handle which is movable between a first position in which said drill bit is retracted to said upper position and a second position in which said drill bit lowered to said drilling position; and wherein c. said drill handle and said latch handle are positioned such that, when said latch handle is in said second position, said drill handle is prevented from being moved from said first to said second position.

16. A method of precisely drilling a pin register hole in a flexible printing plate which is marked with a pin register hole location line and a central cross-hair, said method comprising the steps of:

a. placing said flexible plate on a three-way adjustable table top assembly;

b. clamping said flexible plate in position on said table top assembly;

c. adjusting the plate position by moving an optical viewer with an alignment reticle over said central cross-hair and adjusting said table top assembly, and thus said plate position, until said cross-hair and said reticle are aligned;

d. removing said optical viewer and positioning a drill over at least one pin register hole location in said plate; and e. operating said drill to drill said pin register hole at said pin register hole location.

17. A method as in claim 16, wherein there are a plurality of pin register holes to drill, said method further including the step of moving said drill along said pin register hole line and drilling said plurality of holes along said line.

18. A method as in claim 16, wherein said adjustable table top assembly is positioned on a stationary surface, a vertical support plate is attached to said stationary surface and extends above said adjustable table top assembly, said support plate including a plurality of positioning bores and a track mechanism, and each of said optical viewer and said drill includes slidable brackets for slidably attaching them to said track mechanism and positioning latches for selectively latching them in place at any one of said positioning bores, said optical viewer including a stereomicroscope, said adjusting step including:

a. sliding said stereomicroscope along said track mechanism and latching it in position above a rotational center of said table top assembly by latching said positioning latch in a central one of said positioning bores;

b. viewing said central cross-hair and said reticle through said stereomicroscope; and c. adjusting said table top assembly to align said reticle with said central cross-hair.

19. A method as in claim 18, wherein said adjusting step further includes:

a. sliding said stereomicroscope along said track mechanism to a position near a first end of said flexible plate and latching it in position above said pin register hole location line by latching said positioning latch in one of said positioning bores;

b. viewing said line and said reticle through said stereomicroscope and noting the position difference between the reticle and line; and c. adjusting said table top assembly to divide said position difference in half.

20. A method as in claim 19, wherein said adjusting step further includes:
   a. sliding said stereomicroscope along said track mechanism to a position near a second end of said flexible plate and latching it in position above said pin register hole location line by latching said positioning latch in one of said positioning bores;
   b. again viewing said line and said reticle through said stereomicroscope and noting the position difference between the reticle and line;
   c. adjusting said table top assembly to divide said position difference in half;
   d. repeating said sliding, viewing and adjusting steps for each end of the flexible plate until the line and the reticle are precisely aligned; and
   e. sliding said viewer back to said position over said central cross-hair and adjusting the position of said flexible plate to finally align said reticle and said line.

21. A method as in claim 20, wherein said drill positioning and operating steps include:
   a. sliding said drill along said track mechanism and latching it in position above each of said pin register hole locations by latching said drill positioning latch in respective ones of said positioning bores; and
   b. pulling a control handle on said drill to lower a drill bit into contact with the flexible plate along said line.

22. Apparatus for precisely drilling pin register holes in a pre-marked flexible printing plate, comprising:
   a. a stationary horizontal support surface;
   b. a three-way adjustable table top assembly positioned on said horizontal support surface, said table top assembly being selectively adjustable in orthogonal X and Y axes and also angularly adjustable about an axis;
   c. first adjustment means for selectively adjusting said table top assembly about said axis;
   d. second and third adjustment means for selectively adjusting said adjustable table top assembly in said X and Y directions, respectively;
   e. a vertically oriented elongate support plate positioned above and attached to said horizontal stationary support surface, said support plate including a plurality of positioning bores spaced along its length;
   f. a track mechanism attached to one side of said support plate;
   g. clamp means for selectively clamping said printing plate in position on said table top assembly;
   h. optical means for viewing marks on said flexible plate while said table top assembly is adjusted to align said flexible plate; and
   i. drill means for drilling said pin register holes in said flexible plate.

23. Apparatus as in claim 22, said table top assembly comprising:
   a. a bottom plate which is angularly adjustable about a pivot pin attached between it and said horizontal support surface;
   b. an intermediate plate which is slidably attached to said bottom plate for motion in one of said X or Y directions; and
   c. a top plate which is slidably attached to said intermediate plate for motion in the other of said X and Y directions.

24. Apparatus as in claim 23, said first adjustment means comprising:
   a. a first bracket attached to said stationary support surface, said first bracket including a threaded bore;
   b. a first adjustment knob, said first knob including a threaded shaft extending through said threaded bore in said first bracket; and
   c. a rigid arm attached to said bottom plate and positioned such that said threaded shaft bears against said rigid arm to thereby selectively rotate said bottom plate about said pivot pin as said first knob is turned.

25. Apparatus as in claim 24, said first adjustment means further comprising:
   a. first spring means for biasing said bottom plate against said threaded shaft.

26. Apparatus as in claim 25, said second adjustment means comprising:
   a. a second bracket rigidly attached to said bottom plate, said bracket including a threaded bore;
   b. a second adjustment knob, said second knob including a threaded shaft extending through said threaded bore in said second bracket and contacting one side of said intermediate plate such that said threaded shaft bears against said intermediate plate to thereby slide said intermediate plate relative to said bottom plate in said one of said X and Y directions as said second knob is turned; and
   c. second spring means for biasing said intermediate plate against said threaded shaft.

27. Apparatus as in claim 26, said third adjustment means comprising:
   a. a third bracket rigidly attached to said intermediate plate, said third bracket including a threaded bore;
   b. a third adjustment knob, said third knob including a threaded shaft extending through said threaded bore in said third bracket and contacting one side of said top plate such that said threaded shaft bears against said top plate to thereby slide said top plate relative to said intermediate plate in said other of said X and Y directions as said third knob is turned; and
   c. third spring means for biasing said top plate against said threaded shaft.

28. Apparatus as in claim 27, and further comprising:
   a. a vertically oriented elongate support plate positioned above and attached to a horizontal stationary support surface, said support plate including a plurality of positioning bores spaced along its length; and
   b. a track mechanism attached to one side of said support plate.

29. Apparatus as in claim 28, said optical means comprising:
   a. a support including slide brackets for attachment to said track mechanism such that said optical means is positioned above said table top assembly and is slidable along the length of said track mechanism; and
   b. a stereomicroscope attached to said support, said stereomicroscope being directed downward toward said horizontal support surface and said adjustable table top assembly and including a reticle positioned in the field of vision of the stereomicroscope for comparison against said markings on said flexible printing plate.

30. Apparatus as in claim 29, said stereomicroscope further comprising:
   a. a fixed eyepiece and a movable eyepiece, said fixed eyepiece controlling the position of said reticle such that a viewer perceived reticle position does not change as said movable eyepiece is adjusted.

31. Apparatus as in claim 29, said optical means further comprising:

a. latch means for selectively latching said stereomicroscope in position along said vertical support, said latch means including a pin selectively insertable in any of said positioning bores in said vertical support plate.

32. Apparatus as in claim 28, said drill means comprising:

a. a housing including slide brackets for attachment to said track mechanism such that said drill means is positioned above said horizontal support surface and said table top assembly and is slidable along said vertical support plate;

b. a rotatable hollow core drill bit;

c. a motor for driving said drill bit;

d. drill control means for selectively, vertically moving said drill bit between an upper, retracted position and a lower, drilling position; and e. a stationary rod positioned within the hollow core of said drill bit such that said drill bit extends past a bottom end of said stationary rod when said drill bit is in said drilling position and such that said stationary rod extends past a bottom end of said drill bit rod when said drill bit is in said retracted position.

33. Apparatus as in claim 32, said drill means further comprising:

a. latch means for selectively latching said drill means in position along said vertical support, said latch means including a latch pin selectively insertable in any of said positioning bores in said vertical support plate.

34. Apparatus as in claim 33, wherein:

a. said latch means includes a latch handle movable between a first position in which said latch pin is inserted in a selected one of said positioning bores and a second position in which said latch pin is retracted from said positioning bores;

b. said drill control means includes a drill handle which is movable between a first position in which said drill bit is retracted to said upper position and a second position in which said drill bit lowered to said drilling position; and wherein c. said drill handle and said latch handle are positioned such that, when said latch handle is in said second position, said drill handle is prevented from being moved from said first to said second position.

* * * * *